United States Patent
Muraki et al.

(10) Patent No.: US 11,676,828 B2
(45) Date of Patent: Jun. 13, 2023

(54) SEMICONDUCTOR MANUFACTURING APPARATUS AND MANUFACTURING METHOD OF SEMICONDUCTOR DEVICE

(71) Applicant: Kioxia Corporation, Tokyo (JP)

(72) Inventors: Shinsuke Muraki, Kuwana (JP); Satoshi Nakaoka, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 216 days.

(21) Appl. No.: 17/119,431

(22) Filed: Dec. 11, 2020

(65) Prior Publication Data

US 2021/0296143 A1 Sep. 23, 2021

(30) Foreign Application Priority Data

Mar. 17, 2020 (JP) .............................. JP2020-046623

(51) Int. Cl.
*H01L 21/67* (2006.01)
*H01L 21/311* (2006.01)
*H01L 21/66* (2006.01)

(52) U.S. Cl.
CPC .. *H01L 21/67086* (2013.01); *H01L 21/31111* (2013.01); *H01L 21/67253* (2013.01); *H01L 22/20* (2013.01)

(58) Field of Classification Search
CPC ......... H01L 21/67017; H01L 21/67023; H01L 21/67063; H01L 21/67086
See application file for complete search history.

(56) References Cited

U.S. PATENT DOCUMENTS

| 10,580,668 B2 | 3/2020 | Hinode et al. |
| 2002/0066717 A1* | 6/2002 | Verhaverbeke ..... H01L 21/6704 257/E21.228 |
| 2016/0243461 A1 | 8/2016 | Hanawa et al. |
| 2018/0247841 A1* | 8/2018 | Nagai ............... H01L 21/67253 |
| 2021/0111043 A1 | 4/2021 | Takamatsu et al. |

FOREIGN PATENT DOCUMENTS

| JP | 5-13402 A | 1/1993 |
| JP | 11-342356 A | 12/1999 |
| JP | 2008-147637 A | 6/2008 |
| JP | 4206372 B2 | 1/2009 |
| JP | 2018-56258 A | 4/2018 |
| JP | 6324775 B2 | 5/2018 |
| TW | 201901780 A | 1/2019 |

* cited by examiner

*Primary Examiner* — Jae Lee
(74) *Attorney, Agent, or Firm* — Obion, McClelland, Maier & Neustadt, L.L.P.

(57) ABSTRACT

A semiconductor manufacturing apparatus according to the present embodiment includes a tank, a heater, a bubble supplier, a sensor and a controller. The tank stores a chemical solution for processing a substrate. The heater heats the chemical solution. The bubble supplier supplies bubbles to the chemical solution in the tank. The sensor detects at least one of a concentration of the chemical solution, a water concentration of the chemical solution, specific gravity of the chemical solution and a vapor concentration of a gas discharged from the tank. The controller controls the supply of bubbles by the bubble supplier based on a detection result of the sensor.

11 Claims, 5 Drawing Sheets

SEMICONDUCTOR MANUFACTURING APPARATUS AND MANUFACTURING METHOD OF SEMICONDUCTOR DEVICE

CROSS REFERENCE TO RELATED APPLICATIONS

This application is based upon and claims the benefit of priority from the prior Japanese Patent Application No. 2020-046623, filed on Mar. 17, 2020, the entire contents of which are incorporated herein by reference.

FIELD

The embodiments of the present invention relate to a semiconductor manufacturing apparatus and a manufacturing method of a semiconductor device.

BACKGROUND

In a manufacturing step of a semiconductor device, there may be cases where, for example, a chemical solution is supplied to a substrate and a film formed on the substrate is etched. In this case, a concentration of the chemical solution is to be adjusted in advance so as to obtain a desired etching rate.

However, adjustment of the concentration of a large quantity of chemical solution may be time-consuming.

DETAILED DESCRIPTION

Figure 1:
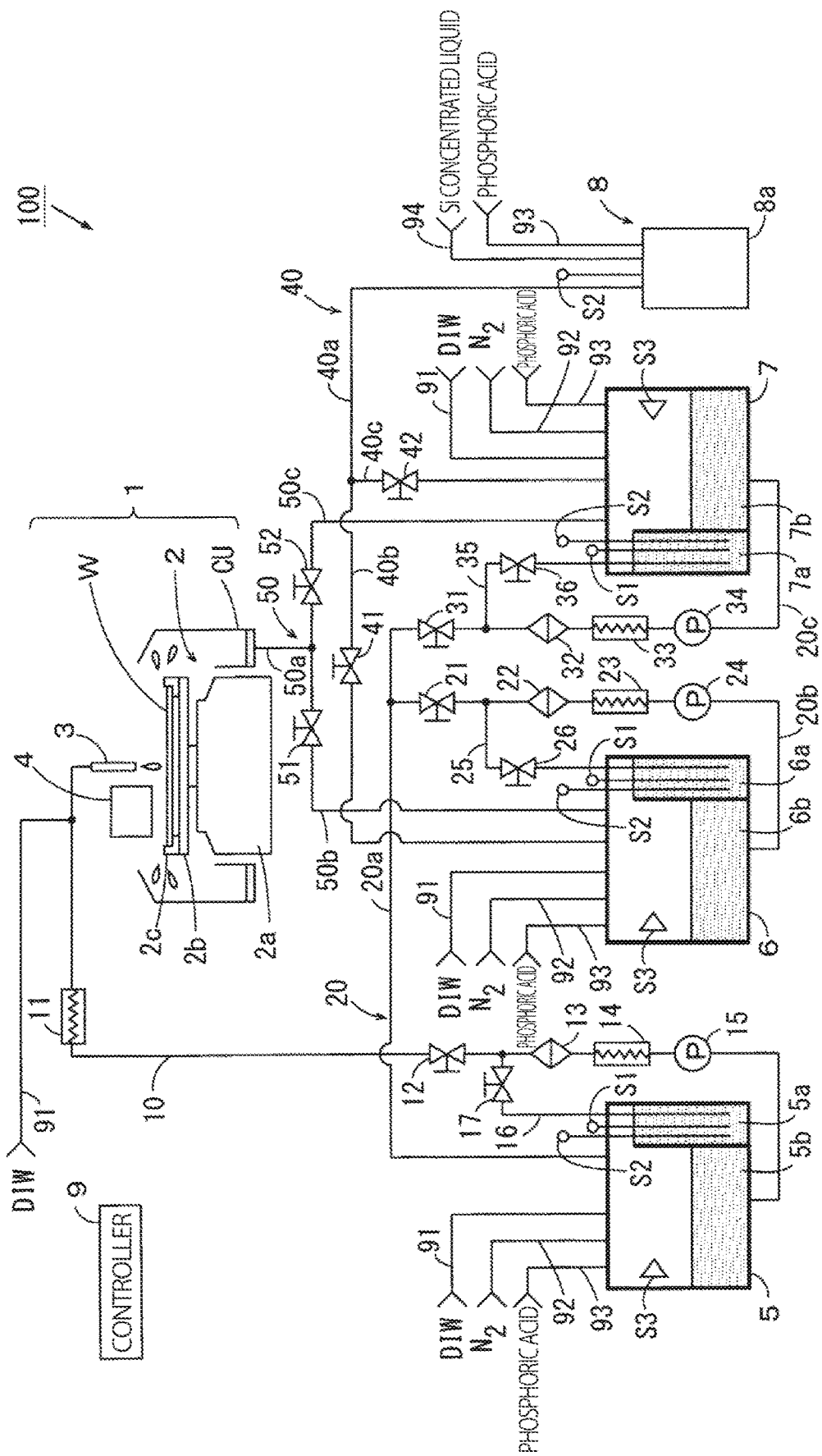
FIG. 1 is a schematic view illustrating a configuration of a semiconductor manufacturing apparatus according to a first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor manufacturing apparatus according to the present embodiment is provided with a tank, a heater, a bubble supplier, a sensor and a controller. The tank stores a chemical solution for processing a substrate. The heater heats the chemical solution. The bubble supplier supplies bubbles to the chemical solution in the tank. The sensor detects at least one of a concentration of the chemical solution, a water concentration of the chemical solution, specific gravity of the chemical solution and a vapor concentration of a gas discharged from the tank. The controller controls the supply of bubbles by the bubble supplier based on a detection result of the sensor.

First Embodiment

The substrate processing apparatus (semiconductor manufacturing apparatus) according to the present embodiment is a single wafer semiconductor manufacturing apparatus that processes substrates one by one. The semiconductor manufacturing apparatus supplies a high temperature phosphoric acid aqueous solution ($H_3PO_4+H_2O$) containing silicon as a processing liquid to a substrate on which a silicon oxide film made of silicon oxide ($SiO_2$) and a silicon nitride film made of silicon nitride ($Si_3N_4$) are formed. In this case, since the phosphoric acid aqueous solution contains silicon, an etching rate of the silicon oxide film decreases. As a result, the silicon nitride film is selectively etched.

When, for example, the silicon nitride film is etched with the phosphoric acid aqueous solution or when a concentrated liquid containing silicon minute particles is mixed with the phosphoric acid aqueous solution, silicon is present in the phosphoric acid aqueous solution.

FIG. 1 is a schematic view illustrating a configuration of the semiconductor manufacturing apparatus according to the first embodiment. As shown in FIG. 1, a semiconductor manufacturing apparatus 100 mainly includes a processor 1, a tank 5, a tank 6, a tank 7, a new liquid supply device 8 and a controller 9. The processor 1 includes a spin chuck 2, a processing liquid nozzle 3, a heating device 4 and a cup CU. The processor 1 performs substrate processing on a plurality of substrates W one by one.

The spin chuck 2 includes a spin motor 2a, a spin base 2b and a plurality of chuck pins 2c. The spin motor 2a is provided such that a rotation shaft thereof is in parallel with a vertical direction. The spin base 2b has a disk shape and is attached to a top end portion of the rotation shaft of the spin motor 2a in a horizontal posture. The plurality of chuck pins 2c are located on a top surface of the spin base 2b and hold a peripheral edge of the substrate W. The spin motor 2a operates with the plurality of chuck pins 2c holding the substrate W. The substrate W thereby rotates around the vertical shaft.

As described above, the mechanical spin chuck 2 that holds peripheral edge of the substrate W is used in this example. Without being limited to this, however, a suction type spin chuck that suctions and holds an undersurface of the substrate W may be used instead of the mechanical spin chuck.

The processing liquid nozzle 3 and the heating device 4 are provided so as to be movable between a position above the substrate W held by the spin chuck 2 and a standby position on a side of the substrate W. The processing liquid nozzle 3 supplies the phosphoric acid aqueous solution supplied from the tank 5 to the substrate W rotated by the spin chuck 2.

When the phosphoric acid aqueous solution is supplied from the processing liquid nozzle 3 to the substrate W, the heating device 4 is disposed at a position facing the top surface of the substrate W. The heating device 4 includes a lamp heater that generates infrared rays and heats the substrate W and the processing liquid supplied to the substrate W with radiant heat. As the lamp heater, for example, a tungsten halogen lamp, a xenon arc lamp or a graphite heater can be used.

A heating temperature of the substrate W by the heating device 4 is set to a temperature (e.g., 140° C. or above and 160° C. or below) higher than a boiling point at a phosphoric acid concentration of the phosphoric acid aqueous solution. Thus, the temperature of the phosphoric acid aqueous solution on the substrate W rises up to the boiling point at the phosphoric acid concentration and the etching rate of the silicon nitride film by the phosphoric acid aqueous solution increases.

On the other hand, when the silicon concentration of the phosphoric acid aqueous solution is within an appropriate range, the etching rate of the silicon oxide film by the phosphoric acid aqueous solution is kept sufficiently lower than the etching rate of the silicon nitride film. As a result, the silicon nitride film on the substrate W is selectively etched.

The cup CU is provided so as to surround the spin chuck 2. The cup CU is lowered when the substrate W is to be carried into or carried out from the spin chuck 2 and is lifted up when the phosphoric acid aqueous solution is to be supplied to the substrate W.

When the phosphoric acid aqueous solution is supplied to the rotating substrate W, the top end portion of the cup CU is located above the substrate W. This allows the phosphoric acid aqueous solution shaken off the substrate W to be received by the cup CU. The phosphoric acid aqueous solution received by the cup CU is sent to the tank 6 or tank 7 as will be described later.

The tank 5 includes a circulation tank 5a and a storage tank 5b. The circulation tank 5a and the storage tank 5b are located next to each other and configured so that the liquid overflowing from one tank (e.g., circulation tank 5a) flows into the other tank (e.g., storage tank 5b). The circulation tank 5a is provided with a phosphoric acid concentration meter S1 and a silicon concentration meter S2. The phosphoric acid concentration meter S1 outputs a phosphoric acid concentration of the phosphoric acid aqueous solution and the silicon concentration meter S2 outputs a silicon concentration of the phosphoric acid aqueous solution. The storage tank 5b is provided with a liquid level sensor S3 that outputs a liquid level height of the phosphoric acid aqueous solution. A DIW (deionized water) supply system 91, a nitrogen (N2) gas supply system 92 and a phosphoric acid aqueous solution supply system 93 are connected to the storage tank 5b.

A supply pipe 10 is provided so as to connect the storage tank 5b of the tank 5 and the processing liquid nozzle 3 of the processor 1. A pump 15, a heater 14, a filter 13, a valve 12 and a heater 11 are inserted in that order in the supply pipe 10 from the storage tank 5b toward the processing liquid nozzle 3.

A circulation pipe 16 is provided so as to connect a portion of the supply pipe 10 between the filter 13 and the valve 12, and the circulation tank 5a. A valve 17 is inserted in the circulation pipe 16. A DIW supply system 91 is connected to a portion of the supply pipe 10 between the heater 11 and the processing liquid nozzle 3.

The tanks 6 and 7 each have the same configuration as the configuration of the tank 5 and include circulation tanks 6a and 7a and storage tanks 6b and 7b. The circulation tanks 6a and 7a are each provided with a phosphoric acid concentration meter S1 and a silicon concentration meter S2. The storage tanks 6b and 7b are each provided with a liquid level sensor S3 and a DIW supply system 91, a nitrogen gas supply system 92 and a phosphoric acid aqueous solution supply system 93 are connected to each of the storage tanks 6b and 7b.

A supply pipe 20 is provided so as to connect the storage tank 5b of the tank 5 and the storage tanks 6b and 7b of the tanks 6 and 7. The supply pipe 20 includes one main pipe 20a and two branch pipes 20b and 20c. The branch pipes 20b and 20c are connected to the main pipe 20a. The main pipe 20a is connected to the storage tank 5b of the tank 5 and the two branch pipes 20b and 20c are connected to the storage tanks 6b and 7b of the tanks 6 and 7 respectively.

A pump 24, a heater 23, a filter 22 and a valve 21 are inserted in that order in the one branch pipe 20b from the storage tank 6b toward the main pipe 20a. A circulation pipe 25 is provided so as to connect a portion of the branch pipe 20b between the filter 22 and the valve 21, and the circulation tank 6a. A valve 26 is inserted in the circulation pipe 25.

A pump 34, a heater 33, a filter 32 and a valve 31 are inserted in that order in the branch pipe 20c from the storage tank 7b toward the main pipe 20a. A circulation pipe 35 is provided so as to connect a portion of the branch pipe 20c between the filter 32 and the valve 31, and the circulation tank 7a. A valve 36 is inserted in the circulation pipe 35.

A collection pipe 50 is provided so as to connect the cup CU of the processor 1 and the storage tanks 6b and 7b of the tanks 6 and 7. The collection pipe 50 includes one main pipe 50a and two branch pipes 50b and 50c. The branch pipes 50b and 50c are connected to the main pipe 50a. The main pipe 50a of the collection pipe 50 is connected to the cup CU and the two branch pipes 50b and 50c are connected to the storage tanks 6b and 7b of the tanks 6 and 7 respectively. A valve 51 is inserted in the branch pipe 50b and a valve 52 is inserted in the branch pipe 50c.

The new liquid supply device 8 includes a mixing tank 8a and a supply device that supplies a liquid in the mixing tank 8a to the outside. A phosphoric acid aqueous solution supply system 93 and a silicon (Si) concentrated liquid supply system 94 are connected to the new liquid supply device 8. The mixing tank 8a is provided with a silicon concentration meter S2.

In the mixing tank 8a of the new liquid supply device 8, a phosphoric acid aqueous solution and a silicon concentrated liquid supplied from the phosphoric acid aqueous solution supply system 93 and the silicon concentrated liquid supply system 94 are mixed at a predetermined ratio. As a result, a phosphoric acid aqueous solution having a predetermined silicon concentration (hereinafter referred to as a "reference silicon concentration") is generated as a new processing liquid and kept at a predetermined temperature. In this example, a liquid in which silicon minute particles are dissolved in the phosphoric acid aqueous solution is used as the silicon concentrated liquid.

The new liquid supply device 8 can also adjust the silicon concentration in the mixing tank 8a to a value different from the reference silicon concentration. For example, a silicon concentrated liquid is added to the inside of the mixing tank 8a while the phosphoric acid aqueous solution having a reference silicon concentration is stored in the mixing tank 8a. Thus, the silicon concentration in the mixing tank 8a can be made higher than the reference silicon concentration. Furthermore, a phosphoric acid aqueous solution is added to the inside of the mixing tank 8a while the phosphoric acid aqueous solution having a reference silicon concentration is stored in the mixing tank 8a. Thus, the silicon concentration in the mixing tank 8a can be made lower than the reference silicon concentration.

A third supply pipe 40 is provided so as to connect the new liquid supply device 8 and the storage tanks 6b and 7b of the tanks 6 and 7. The third supply pipe 40 includes one main pipe 40a and two branch pipes 40b and 40c. The branch pipes 40b and 40c are connected to the main pipe 40a. The main pipe 40a of the third supply pipe 40 is connected to the new liquid supply device 8 and the two branch pipes 40b and 40c are connected to the storage tanks 6b and 7b of the tanks 6 and 7 respectively. A valve 41 is inserted in the branch pipe 40b and a valve 42 is inserted in the branch pipe 40c.

The controller 9 is constructed of a CPU (central processing unit) and a memory or a microcomputer or the like. A system program is recorded in the memory of the controller 9. The controller 9 controls operation of each component of the semiconductor manufacturing apparatus 100.

Next, operation of the substrate processing of the semiconductor manufacturing apparatus 100 shown in FIG. 1 will be described.

In an initial state, a phosphoric acid aqueous solution having a predetermined phosphoric acid concentration (hereinafter referred to as a "reference phosphoric acid concentration") as well as a reference silicon concentration is stored in the tanks 5 and 6.

Furthermore, a phosphoric acid aqueous solution having neither reference phosphoric acid concentration nor reference silicon concentration is stored in the tank 7. All the valves 12, 17, 21, 26, 31, 36, 41, 42, 51 and 52 shown in FIG. 1 are closed.

When power of the semiconductor manufacturing apparatus 100 is turned on from the initial state, operations of the heaters 11, 14, 23 and 33, the pumps 15, 24 and 34 and the new liquid supply device 8 in FIG. 1 are started. In this state, a first substrate W is carried in the spin chuck 2 of the processor 1. The substrate W is held and rotated by the spin chuck 2.

After that, the controller 9 in FIG. 1 opens the valves 12 and 17 in FIG. 1. As a result, the phosphoric acid aqueous solution in the storage tank 5b is suctioned by the pump 15 and sent to the filter 13 through the heater 14. The heater 14 heats the phosphoric acid aqueous solution passing through the supply pipe 10 to a predetermined temperature (e.g., 150° C.). The filter 13 filters the phosphoric acid aqueous solution and thereby removes unnecessary deposits or the like.

Part of the phosphoric acid aqueous solution that has passed through the heater 14 and the filter 13 is further heated through the heater 11 and sent to the processing liquid nozzle 3. Thus, the phosphoric acid aqueous solution having the reference phosphoric acid concentration and the reference silicon concentration together with DIW is supplied from the processing liquid nozzle 3 to the substrate W. Note that DIW is supplied between the heater 11 and the processing liquid nozzle 3 from the DIW supply system 91 as appropriate.

On the other hand, the remainder of the phosphoric acid aqueous solution that has passed through the heater 14 and the filter 13 is returned to the circulation tank 5a of the tank 5 through the circulation pipe 16. In the tank 5, the phosphoric acid aqueous solution overflowing from the circulation tank 5a flows into the storage tank 5b. Thus, the phosphoric acid aqueous solution in the storage tank 5b passes through the supply pipe 10, the circulation pipe 16 and the circulation tank 5a while being heated and filtered, and is returned to the inside of the storage tank 5b. In this way, a temperature and cleanliness of the phosphoric acid aqueous solution in the storage tank 5b are kept substantially constant.

The operation of returning part of the phosphoric acid aqueous solution stored in the storage tank 5b to the storage tank 5b while heating and filtering part of the phosphoric acid aqueous solution so as to keep constant the temperature and cleanliness of the phosphoric acid aqueous solution in the storage tank 5b is called "circulation temperature adjustment."

Next, operation of solution processing of the semiconductor manufacturing apparatus 100 shown in FIG. 1 will be described.

The controller 9 in FIG. 1 further opens the valve 52 in FIG. 1. Thus, the used phosphoric acid aqueous solution to be collected by the cup CU of the processor 1 is sent to the storage tank 7b of the tank 7 via the main pipe 50a and the branch pipe 50c. In this way, the operation of sending the used phosphoric acid aqueous solution supplied to the substrate W to the storage tank 7b is called "liquid collection."

The controller 9 in FIG. 1 further opens the valves 26 and 36. Thus, circulation temperature adjustment similar to that in the tank 5 is performed in the tank 6 and the tank 7 as well.

Here, when the liquid collection and the circulation temperature adjustment are performed in the tank 7, the phosphoric acid concentration of the phosphoric acid aqueous solution stored in the storage tank 7b is different from the reference phosphoric acid concentration. In consequence, the controller 9 in FIG. 1 brings the phosphoric acid concentration in the storage tank 7b closer to the reference phosphoric acid concentration based on the output of the phosphoric acid concentration meter S1 in the tank 7. Note that details of concentration adjustment will be described later with reference to FIG. 2 to FIG. 4.

For example, while the tank 7 is performing liquid collection, the tank 6 adjusts the phosphoric acid concentration and supplies the phosphoric acid to the tank 5 via the main pipe 20a. After that, operations of the tank 7 and the tank 6 are switched. That is, the tank 6 performs liquid collection and the tank 7 adjusts the phosphoric acid concentration and supplies the phosphoric acid to the tank 5 via the main pipe 20a. In this way, the tanks 6 and 7 alternately perform liquid collection and concentration adjustment of the phosphoric acid every predetermined time.

Note that the supply of the phosphoric acid aqueous solution from the tank 5 to the processing liquid nozzle 3 continues until the processing on the substrate W ends. Moreover, circulation temperature adjustment in the tank 5, tank 6 and tank 7 also continues until the processing on the substrate W ends.

Figure 2:
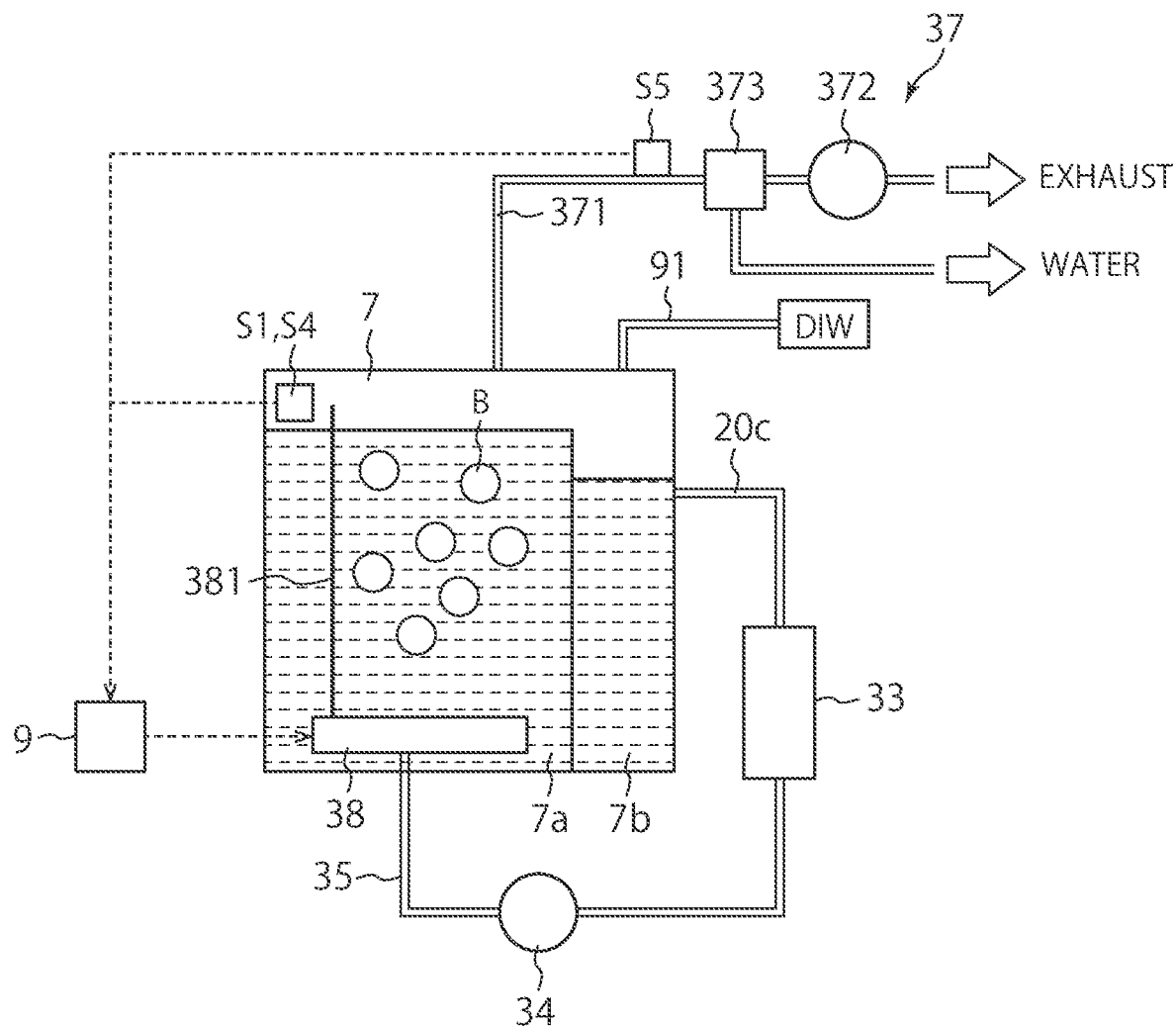
FIG. 2 is a diagram illustrating a configuration of a tank and surroundings thereof according to the first embodiment.

FIG. 2 is a diagram illustrating a configuration of the tank 7 and surroundings thereof according to the first embodiment. Note that the order of the heater 33 and the pump 34 is different between FIG. 2 and FIG. 1.

The semiconductor manufacturing apparatus 100 is provided with the tank (container) 7, the heater 33, the circulation pipe (circulation path) 35, the pump 34, the bubble supplier 38, an exhauster 37, the DIW supply system 91, a sensor and the controller 9.

The tank 7 stores a chemical solution for processing the substrate W. The chemical solution processes a processed film provided on the substrate W. The chemical solution is, for example, an etching liquid such as a phosphoric acid aqueous solution. In this case, a silicon nitride film ($Si_3N_4$) or a metal film or the like can be processed. Note that the chemical solution can be a hydrofluoric acid aqueous solution, for example. In this case, the silicon oxide film ($SiO_2$) or the like can be removed. The tank 7 stores a chemical solution of 40L, for example.

More specifically, the tank 7 includes the circulation tank 7a and the storage tank 7b.

The circulation tank 7a stores the chemical solution.

The storage tank 7b receives the chemical solution overflowing (spilling) from the circulation tank 7a. The storage tank 7b may be provided on outer periphery of the circulation tank 7a.

The circulation pipe 35 allows the chemical solution to circulate in the tank 7. More specifically, the circulation pipe 35 allows the chemical solution to circulate between the circulation tank 7a and the storage tank 7b. One end of the circulation pipe 35 is connected to the storage tank 7b and the other end is connected to the bubble supplier 38 in the circulation tank 7a. Note that the circulation pipe 35 may include the branch pipe 20c shown in FIG. 2.

The pump 34 is provided in the path of the circulation pipe 35 (branch pipe 20c), suctions the chemical solution in the storage tank 7b and circulates the chemical solution into the circulation tank 7a.

The heater 33 as a heater heats the chemical solution. This causes water in the chemical solution to evaporate, and can increase the concentration of the chemical solution. The heater 33 is provided in the path of the circulation pipe 35 (branch pipe 20c). That is, the heater 33 heats the circulating chemical solution. The heater 33 causes the temperature of the chemical solution in the tank 7 to be kept substantially constant. The controller 9 performs, for example, PID control on the heater 33 based on a detection result of a thermometer (not shown) provided at the circulation pipe 35. The temperature of the chemical solution is adjusted to be 100° C. or above, for example.

The bubble supplier 38 supplies bubbles B to the chemical solution in the tank 7. Water in the chemical solution evaporates from surfaces of the bubbles B. Therefore, the bubbles B can increase a surface area of the chemical solution and promote evaporation of water. This makes it possible to shorten the time for adjusting the concentration of the chemical solution. The bubble supplier 38 is preferably enabled to supply a large quantity of bubbles B so as to shorten the adjustment time.

The bubble supplier 38 is provided in the tank 7. The bubble supplier 38 is provided in a lower part of the tank 7. This allows bubbles to be generated from a lower part of the tank 7, causing water to evaporate more easily.

More specifically, the bubble supplier 38 mixes the chemical solution to be circulated with a gas and supplies the chemical solution into the tank 7, and thereby supplies the bubbles B to the chemical solution in the tank 7. More specifically, the bubble supplier 38 mixes the chemical solution to be circulated with the gas and supplies the chemical solution into the circulation tank 7a. Note that details of the bubble supplier 38 will be described later with reference to FIG. 3.

The exhauster 37 exhausts the inside of the tank 7. Since water evaporates in the tank 7 to adjust a concentration, the vapor needs to be exhausted. More specifically, the exhauster 37 includes an exhaust pipe 371, a pump 372 and a gas-liquid separator 373.

The gas exhausted from the tank 7 passes through the exhaust pipe 371.

The pump 372 suctions the gas in the tank 7 and exhausts the gas to the outside.

The gas-liquid separator 373 is provided in the path of the exhaust pipe 371. The gas-liquid separator 373 cools the gas passing through the exhaust pipe 371. This is because the gas exhausted from the tank 7 may contain high temperature vapor, adversely affecting the piping or the like of an ordinary exhaust system. The gas-liquid separator 373 exhausts condensed water to the outside.

The DIW supply system 91 as a water supplier supplies DIW (water) to the chemical solution in the tank 7. More specifically, the DIW supply system 91 supplies DIW to the storage tank 7b. In this way, for example, when water evaporation is large and the concentration of the chemical solution is high, it is possible to lower the concentration of the chemical solution.

The sensor detects at least one of a concentration of the chemical solution, a water concentration of the chemical solution, specific gravity of the chemical solution and a vapor concentration of gas exhausted from the tank 7. A plurality of sensors may be provided. The sensor may be at least one of the concentration meter S1, the hydrometer S4 and the vapor concentration meter S5. The concentration meter S1 may detect a chemical solution concentration or a water concentration. The hydrometer S4 is, for example, a pressure sensor or an optical sensor. A concentration of the chemical solution can be calculated using specific gravity. The concentration meter S1 and the hydrometer S4 are provided in the circulation tank 7a, for example. The vapor concentration meter S5 is provided, for example, in the path of the exhaust pipe 371 in front of the gas-liquid separator 373. Since the concentration of the chemical solution is adjusted by water evaporation, the vapor concentration of the exhausted gas has a correlation with the concentration of the chemical solution in the tank 7. The sensor transmits the detection result to the controller 9.

Note that the sensor will be described as the concentration meter S1 that detects a phosphoric acid concentration unless otherwise specified hereinafter.

The controller 9 controls the supply of bubbles B by the bubble supplier 38 based on the detection result of the concentration meter S1. That is, the controller 9 performs feedback control using the detection result of the concentration meter S1. It is thereby possible to adjust the concentration of the chemical solution so as to obtain a predetermined concentration. More specifically, the controller 9 controls the supply of bubbles by the bubble supplier 38 and the supply of DIW by the DIW supply system 91 so that the detection result of the concentration meter 51 reaches a predetermined value. The predetermined value is set in response to, for example, a desired etching rate of the chemical solution. The predetermined value is a reference concentration (reference phosphoric acid concentration) and is a concentration of approximately 90%, for example.

Figure 3:
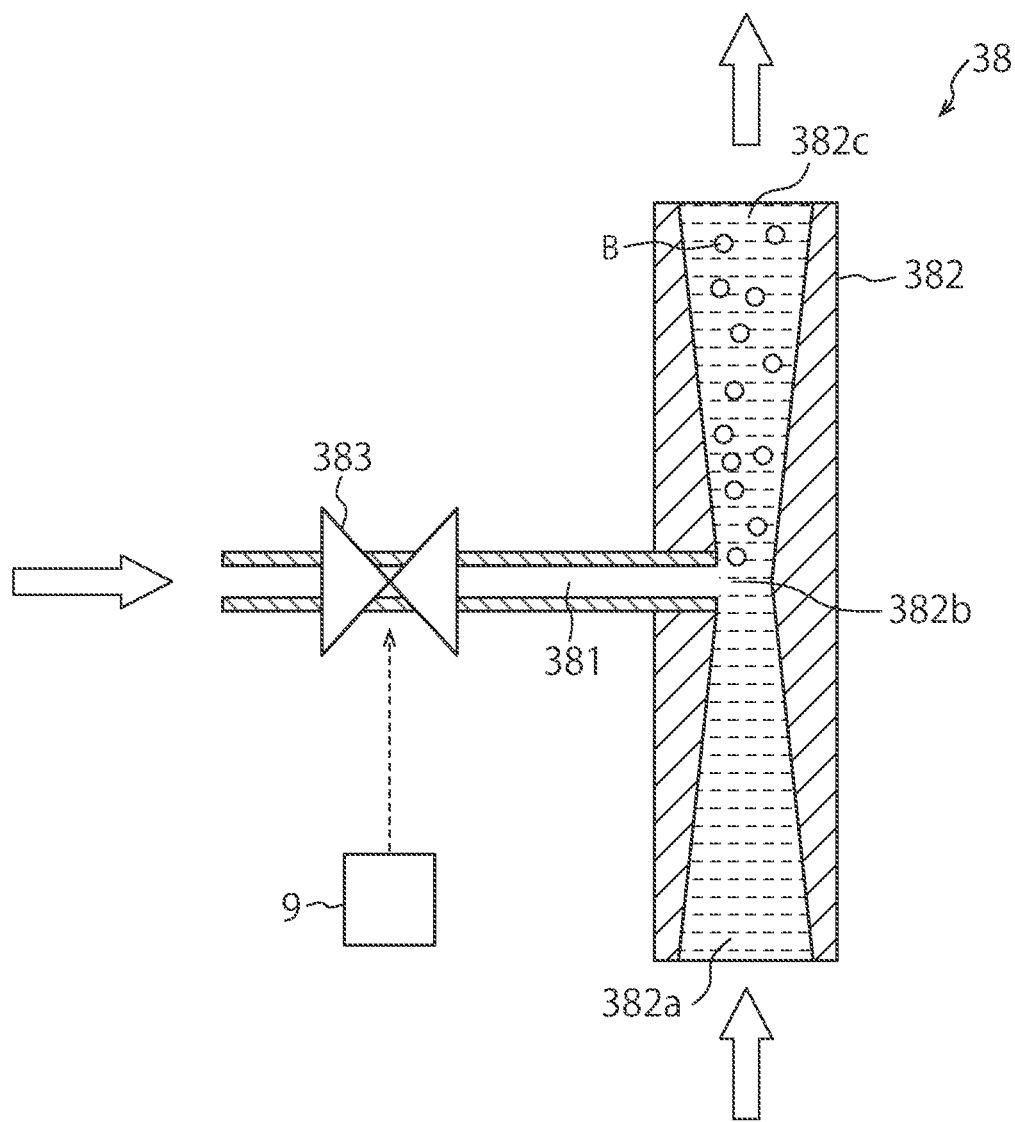
FIG. 3 is a diagram illustrating a configuration of a bubble supplier according to the first embodiment.

FIG. 3 is a diagram illustrating a configuration of the bubble supplier 38 according to the first embodiment. Note that arrows represent flow directions of the chemical solution and the gas.

The bubble supplier 38 includes an intake pipe (intake path) 381, a pipe (flow path) 382 and an adjuster 383. The bubble supplier 38 is, for example, an ejector.

A gas outside the chemical solution passes through the intake pipe 381. One end of the intake pipe 381 is connected to the pipe 382. As shown in FIG. 2, the other end of the intake pipe 381 is provided above the surface of water of the chemical solution.

The chemical solution passes through the pipe 382. The pipe 382 mixes the chemical solution with the gas passing through the intake pipe 381. The pipe 382 includes a lead-in port 382a, a nozzle 382b and a lead-out port 382c.

The lead-in port 382a introduces the chemical solution from the circulation pipe 35. The nozzle 382b is connected to the intake pipe 381. The lead-out port 382c leads the chemical solution into the tank 7.

The flow path diameter of the pipe 382 decreases from the lead-in port 382a to the nozzle 382b and increases from the nozzle 382b to the lead-out port 382c. In the nozzle 382b, the channel diameter of which is narrowest, the flow rate of the chemical solution is fastest, and so the nozzle 382b is decompressed due to a Venturi effect. Therefore, when the chemical solution passes through the pipe 382, a gas (air) is drawn into the nozzle 382b, which is in a decompressed state from above the water surface of the chemical solution. Furthermore, the gas is mixed with the chemical solution from the nozzle 382b to the lead-out port 382c. Therefore, the chemical solution that passes through the lead-out port 382c contains bubbles B.

The adjuster 383 is provided in the path of the intake pipe 381. The adjuster 383 adjusts passage of the gas. The adjuster 383 is, for example, a valve, an opening degree of which is adjustable. For example, the larger the amount of opening of the adjuster 383, the more gas passes through the intake pipe 381 and the more bubbles B are supplied. By controlling the adjuster 383, the controller 9 controls the supply of bubbles by the bubble supplier 38.

Next, a manufacturing method of a semiconductor device will be described.

Figure 4:
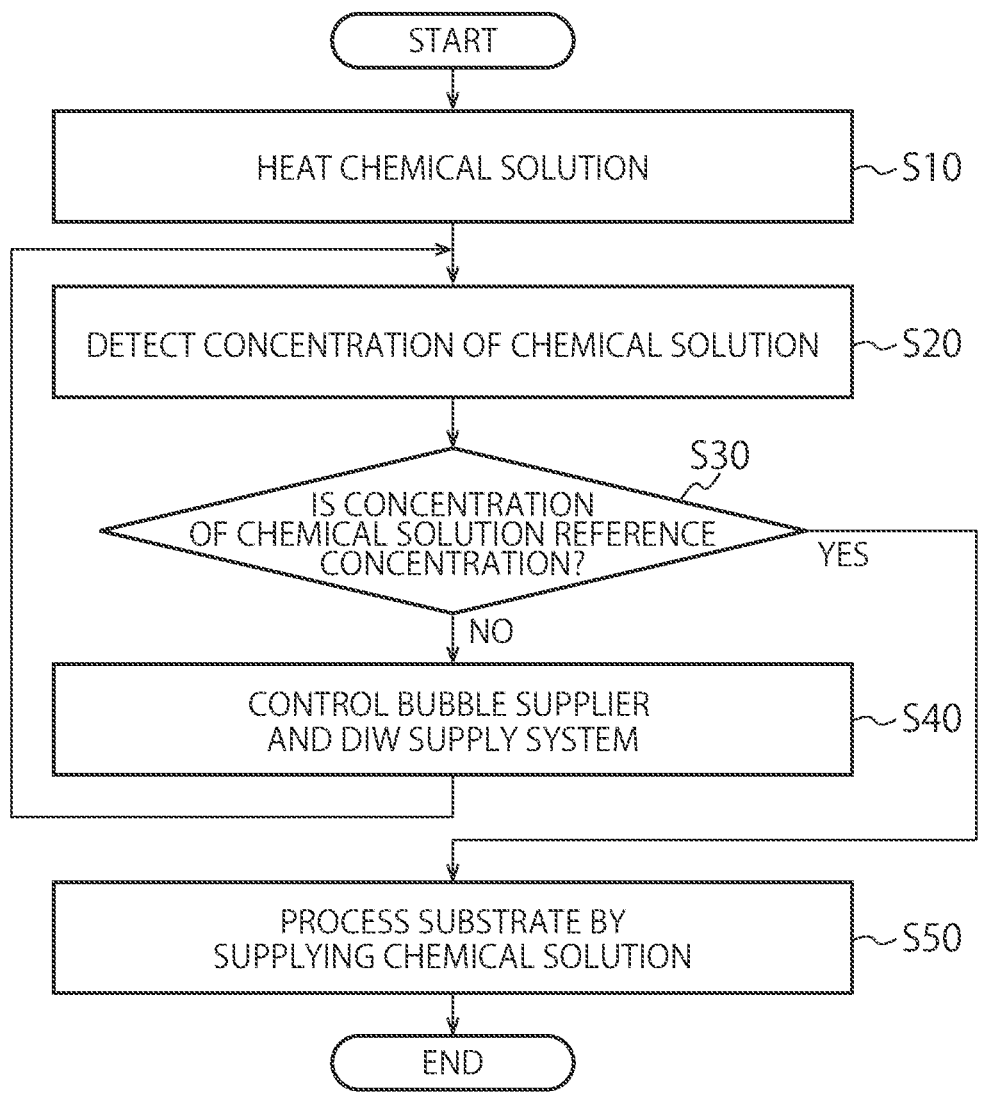
FIG. 4 is a flowchart illustrating operation of the semiconductor manufacturing apparatus according to the first embodiment.

FIG. 4 is a flowchart illustrating operation of the semiconductor manufacturing apparatus 100 according to the first embodiment. Note that FIG. 4 illustrates steps of chemical solution concentration adjustment and substrate processing.

First, the heater 33 heats the chemical solution (S10). That is, the heater 33 heats the chemical solution in the tank 7 that stores the chemical solution for processing the substrate W. For example, the pump 34 circulates the chemical solution and the heater 33 heats the chemical solution to be circulated.

Next, the concentration meter S1 detects the concentration of the chemical solution (S20). The concentration meter S1 transmits the detection result to the controller 9.

Next, the controller 9 determines whether the chemical solution is a reference concentration or not (S30). When the chemical solution is not the reference concentration (NO in S30), the controller 9 controls the bubble supplier 38 and the DIW supply system 91. For example, when the concentration of the chemical solution is lower than the reference concentration, the controller 9 controls the bubble supplier 38 so as to increase the amount of bubbles supplied. On the other hand, when the concentration of the chemical solution is higher than the reference concentration, the controller 9 controls the DIW supply system 91 so as to increase the amount of water supplied. After that, step S20 is executed. Therefore, steps S20 to S40 are repeatedly executed until the concentration of the chemical solution reaches the reference concentration. That is, the controller 9 controls the supply of bubbles B by the bubble supplier 38 for supplying bubbles B to the chemical solution in the tank 7 based on the detection result of the concentration meter S1. More specifically, the controller 9 controls the supply of bubbles by the bubble supplier 38 and the supply of DIW by the DIW supply system 91 so that the detection result of the concentration meter S1 reaches a predetermined value.

When the chemical solution is a phosphoric acid aqueous solution, the concentration of the chemical solution is adjusted from approximately 85% at the time of injection of the chemical solution into the semiconductor manufacturing apparatus 100 to approximately 90%, which is a reference concentration.

When the concentration of the chemical solution is the reference concentration (YES in S30), the semiconductor manufacturing apparatus 100 processes the substrate W by a supply of the chemical solution (S50). That is, the substrate W is processed with the chemical solution in the tank 7. In this way, it is possible to adjust the concentration of the chemical solution so as to obtain a desired etching rate and remove a silicon nitride film which is the processed film on the substrate W. Note that the substrate W is processed as described with reference to FIG. 1. Therefore, when the concentration falls within a predetermined range when a predetermined time has passed after the start of concentration adjustment, the chemical solution is supplied from the tank 7 to the tank 5.

As described above, according to the first embodiment, the bubble supplier 38 supplies bubbles B to the chemical solution in the tank 7. The controller 9 controls the supply of bubbles B by the bubble supplier 38 based on the detection result of the concentration meter S1. This makes it possible to introduce bubbles B into the chemical solution and promote evaporation of water. That is, the speed of increasing the concentration of the chemical solution improves. As a result, it is possible to shorten the time of adjusting the concentration of the chemical solution. Furthermore, it is possible to improve processing capacity per unit time of the semiconductor manufacturing apparatus 100.

Generally, the larger the amount of chemical solution, the concentration of which is adjusted, the more time is required for concentration adjustment. Depending on this standby time, throughput may deteriorate. Providing a new tank for concentration adjustment may result in increased footprint of the apparatus.

Increasing the area of the tank and increasing the surface area of the chemical solution are known as another method for promoting water evaporation. However, in this case, footprint of the apparatus may also increase. Therefore, processing efficiency of the semiconductor manufacturing apparatus per unit area may deteriorate.

On the contrary, it is possible to promote water evaporation without changing (increasing) the tank area by the bubble supplier 38 in the first embodiment. The bubble supplier 38 is provided in the tank 7. Therefore, the adjustment time can be shortened without significantly changing the configuration around the tank 7.

Note that the concentration meter S1 may be a water concentration meter that detects a water concentration of the chemical solution.

As described so far, the sensor is not limited to the concentration meter S1 but may be a hydrometer S4 or a vapor concentration meter S5. In this case, in step S20 in FIG. 4, the sensor detects at least one of a concentration of the chemical solution, a water concentration of the chemical solution, specific gravity of the chemical solution and a vapor concentration of gas discharged from the tank 7. The controller 9 may determine whether the measured specific gravity or vapor concentration is specific gravity or vapor concentration (predetermined value) corresponding to the reference concentration of the chemical solution or not. The controller 9 may control the supply of bubbles B by combining a plurality of detection results of the phosphoric acid concentration meter S1, the hydrometer S4 and the vapor concentration meter S5.

The above concentration adjustment may be performed for at least one of the tanks 5, 6 and 7 shown in FIG. 1 without being limited to the tank 7. That is, the tank 7 shown in FIG. 2 may be, for example, the tanks 5 and 6 shown in FIG. 1. In this case, the branch pipe 20c is, for example, the supply pipe 10 or the branch pipe 20b shown in FIG. 1. The heater 33 is, for example, the heater 14 or 23 shown in FIG. 1. The pump 34 is, for example, the pump 15 or 24 shown in FIG. 1. The circulation pipe 35 is, for example, the circulation pipe 16 or 25 shown in FIG. 1.

The controller 9 may control, for example, the pump 34 to adjust the supply of bubbles. For example, when the flow rate of the chemical solution to be circulated by the pump 34 increases, the amount of air drawn from the intake pipe 381 increases, and so the amount of bubbles supplied by the bubble supplier 38 increases.

Second Embodiment

Figure 5:
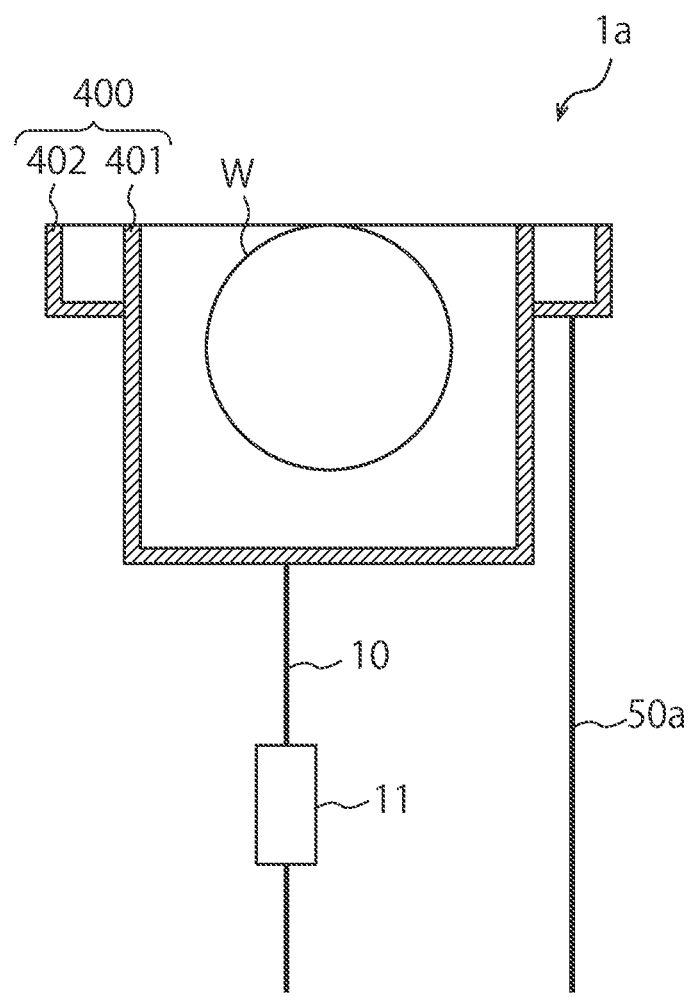
FIG. 5 is a schematic view illustrating a configuration of a processor and surroundings thereof according to a second embodiment.

FIG. 5 is a schematic view illustrating a configuration of a processor 1a and surroundings thereof according to a second embodiment. The second embodiment is different from the first embodiment in that it is a batch type semiconductor manufacturing apparatus 100 that processes a plurality of substrates W in a batch.

The semiconductor manufacturing apparatus 100 is further provided with a tank 400.

The tank 400 includes an inner tank 401 and an outer tank 402. The tank 400 may perform circulation temperature adjustment with a circulation pipe (not shown) or the like provided between the inner tank 401 and the outer tank 402 like the tanks 5, 6 and 7.

The inner tank 401 stores a chemical solution. A supply pipe 10 similar to the supply pipe in FIG. 1 is connected to the inner tank 401. A heater 11 similar to the heater in FIG. 1 is provided in the path of the supply pipe 10. Therefore, the chemical solution is supplied from the tank 5 into the inner tank 401.

The outer tank 402 is provided so as to surround a whole circumference of the inner tank 401, and receives and collects the chemical solution overflowing from the inner tank 401. A main pipe 50a similar to the main pipe in FIG. 1 is connected to the outer tank 402. Therefore, the chemical solution of the outer tank 402 is collected to the tank 6 or the tank 7 shown in FIG. 1.

The other components of the semiconductor manufacturing apparatus 100 according to the second embodiment are similar to the components corresponding to the semiconductor manufacturing apparatus 100 according to the first embodiment, and therefore detailed description thereof will be omitted.

In the second embodiment, the tank 6 and the tank 7 alternately perform liquid collection and concentration adjustment of the chemical solution as well. Therefore, the tank 7 may adjust the concentration of the chemical solution as in the case of the first embodiment.

Next, operation of substrate processing on the semiconductor manufacturing apparatus 100 according to the second embodiment will be described.

First, the chemical solution is stored in the tank 400 via the supply pipe 10. That is, the chemical solution adjusted to have a desired etching rate is stored in the tank 400. Next, the substrate W is immersed in the chemical solution stored in the inner tank 401. For example, a holder (not shown) that holds a plurality of substrates W is lowered in a vertical direction to thereby immerse the substrate W in the chemical solution. The silicon nitride film on the substrate W is thereby removed.

The semiconductor manufacturing apparatus 100 according to the second embodiment can obtain effects similar to the effects of the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
    a tank configured to store a chemical solution for processing a substrate;
    a heater configured to heat the chemical solution;
    a bubble supplier configured to supply bubbles to the chemical solution in the tank, the chemical solution to which bubbles are supplied being heated by the heater;
    a sensor configured to detect at least one of a concentration of the chemical solution, a water concentration of the chemical solution, specific gravity of the chemical solution and a vapor concentration of a gas discharged from the tank; and
    a controller configured to control the supply of bubbles by the bubble supplier based on a detection result of the sensor, wherein
    the bubble supplier comprises:
        an intake path through which a gas outside the chemical solution passes; and
        a flow path through which the chemical solution passes, the flow path being configured to mix the chemical solution with the gas passing through the intake path,
    the flow path comprises a connection which is connected to one end of the intake path,
    a flow path diameter of the flow path decreases from an upstream side of the connection to the connection and increases from the connection to a downstream side of the connection,
    the intake path draws a gas into the connection, and
    the other end of the intake path is provided above a water surface of the chemical solution.

2. The semiconductor manufacturing apparatus according to claim 1, further comprising a circulation path configured to circulate the chemical solution in the tank, wherein
    the heater heats the chemical solution to be circulated, and
    the bubble supplier mixes the chemical solution to be circulated with a gas and supplies the chemical solution into the tank to thereby supply bubbles to the chemical solution in the tank.

3. The semiconductor manufacturing apparatus according to claim 2, wherein
    the tank comprises a first tank configured to store the chemical solution and a second tank configured to receive the chemical solution overflowing from the first tank,
    the circulation path circulates the chemical solution between the first tank and the second tank, and
    the bubble supplier mixes the chemical solution to be circulated with the gas and supplies the chemical solution into the first tank.

4. The semiconductor manufacturing apparatus according to claim 1, wherein
the bubble supplier further comprises an adjuster provided in a path of the intake path and configured to adjust passage of the gas, and
the controller controls the adjuster to thereby control the supply of bubbles by the bubble supplier.

5. The semiconductor manufacturing apparatus according to claim 1, further comprising an exhauster configured to exhaust an inside of the tank, wherein
the exhauster comprises a gas-liquid separator which cools the gas exhausted from the tank to thereby turn vapor contained in the gas exhausted from the tank into condensed water.

6. The semiconductor manufacturing apparatus according to claim 5, wherein
the bubble supplier further comprises an adjuster provided in a path of the intake path and configured to adjust passage of the gas, and
the controller controls the adjuster to thereby control the supply of bubbles by the bubble supplier.

7. The semiconductor manufacturing apparatus according to claim 1, further comprising a water supplier configured to supply water to the chemical solution in the tank to lower the concentration of the chemical solution, wherein
the controller controls the supply of bubbles by the bubble supplier and the supply of water by the water supplier so that a detection result of the sensor becomes a predetermined value,
the controller controls the bubble supplier to increase an amount of bubbles supplied when the concentration of the chemical solution corresponding to the detection result of the sensor is lower than a reference concentration, and
the controller controls the water supplier to increase an amount of water supplied when the concentration of the chemical solution corresponding to the detection result of the sensor is higher than the reference concentration.

8. The semiconductor manufacturing apparatus according to claim 7, wherein
the bubble supplier further comprises an adjuster provided in a path of the intake path and configured to adjust passage of the gas, and
the controller controls the adjuster to thereby control the supply of bubbles by the bubble supplier.

9. The semiconductor manufacturing apparatus according to claim 1, wherein the bubble supplier is provided in a lower part of the tank.

10. The semiconductor manufacturing apparatus according to claim 9, wherein
the bubble supplier further comprises an adjuster provided in a path of the intake path and configured to adjust passage of the gas, and
the controller controls the adjuster to thereby control the supply of bubbles by the bubble supplier.

11. A manufacturing method of a semiconductor device comprising:
heating a chemical solution for processing a substrate using a heater, the chemical solution being stored in a tank;
detecting at least one of a concentration of the chemical solution, a water concentration of the chemical solution, specific gravity of the chemical solution and a vapor concentration of a gas discharged from the tank, using a sensor;
controlling the supply of bubbles by a bubble supplier configured to supply bubbles to the chemical solution in the tank, by a controller based on a detection result of the sensor, the chemical solution to which bubbles are supplied being heated by the heater;
processing the substrate with the chemical solution in the tank;
controlling the supply of bubbles by the bubble supplier and the supply of water by a water supplier configured to supply water to the chemical solution in the tank to lower the concentration of the chemical solution, by the controller so that a detection result of the sensor becomes a predetermined value before processing the substrate;
increasing an amount of bubbles supplied, by the controller when the concentration of the chemical solution corresponding to the detection result of the sensor is lower than a reference concentration; and
decreasing an amount of water supplied, by the controller when the concentration of the chemical solution corresponding to the detection result of the sensor is higher than the reference concentration.

* * * * *